United States Patent
Vardi

(10) Patent No.: US 10,244,687 B1
(45) Date of Patent: Apr. 2, 2019

(54) LED GROW LIGHT SYSTEM

(71) Applicant: Spectrum King LLC, Canoga Park, CA (US)

(72) Inventor: Rami Vardi, Woodland Hills, CA (US)

(73) Assignee: Spectrum King LLC, Canoga Park, CA (US)

(*) Notice: Subject to any disclaimer, the term of this patent is extended or adjusted under 35 U.S.C. 154(b) by 11 days.

(21) Appl. No.: 15/908,539

(22) Filed: Feb. 28, 2018

(51) Int. Cl.
| | |
|---|---|
| H01L 33/50 | (2010.01) |
| A01G 7/04 | (2006.01) |
| A01G 9/20 | (2006.01) |
| F21K 9/23 | (2016.01) |
| F21Y 115/10 | (2016.01) |

(52) U.S. Cl.
CPC .............. *A01G 7/045* (2013.01); *A01G 9/20* (2013.01); *F21K 9/23* (2016.08); *H01L 33/50* (2013.01); *F21Y 2115/10* (2016.08)

(58) Field of Classification Search
CPC .......... F21K 9/64; F21V 7/22; F21Y 2115/10; F21Y 2103/10; G02F 1/133603; G02F 2001/133614; G02F 1/133514; H01L 33/50; H01L 33/46; H01L 33/504; G02B 5/289
See application file for complete search history.

(56) References Cited

U.S. PATENT DOCUMENTS

| | | | | |
|---|---|---|---|---|
| 7,026,663 B2* | 4/2006 | Krames | ................... | H01L 33/44 257/103 |
| 7,649,734 B2* | 1/2010 | Okumura | .......... | G06K 19/07732 361/679.33 |
| 7,682,850 B2* | 3/2010 | Harbers | ............. | C09K 11/7774 257/98 |
| 9,423,084 B2* | 8/2016 | Lee | .......................... | F21V 9/30 |
| 2008/0179609 A1* | 7/2008 | Trottier | ................... | H01L 33/44 257/98 |
| 2009/0236619 A1* | 9/2009 | Chakroborty | ........... | H01L 33/44 257/89 |
| 2010/0232133 A1* | 9/2010 | Tran | ................. | B29D 11/00634 362/84 |
| 2010/0232134 A1* | 9/2010 | Tran | ......................... | F21V 9/08 362/84 |
| 2011/0175518 A1* | 7/2011 | Reed | ........................ | F21V 7/05 313/483 |
| 2012/0039065 A1* | 2/2012 | Sun | ...................... | G02B 27/141 362/84 |

(Continued)

*Primary Examiner* — Hargobind S Sawhney
(74) *Attorney, Agent, or Firm* — Lowry Blixseth LLP; Scott M. Lowry

(57) ABSTRACT

The LED grow light system includes an LED coupled to a circuit board, a phosphor layer generally positioned at least partially over the LED coupled to the circuit board, and a filter positioned in light receiving relation relative to the LED coupled to the circuit board and in light reflective relation relative to the phosphor layer. The filter includes a material at least partially reflective of at least a first light output wavelength emitted from the LED for redirection back into the phosphor layer where the reflected first light output wavelength converts to a second light output wavelength for recycled emission out from the LED grow light system as a composite light output component that includes a mixture of the first light output wavelength and the second light output wavelength.

101 Claims, 7 Drawing Sheets

(56) References Cited

U.S. PATENT DOCUMENTS

| | | | | |
|---|---|---|---|---|
| 2012/0112661 A1* | 5/2012 | van de Ven | ........ | H05B 33/0803 |
| | | | | 315/294 |
| 2013/0015478 A1* | 1/2013 | Oh | ........ | F21S 41/147 |
| | | | | 257/98 |
| 2014/0034988 A1* | 2/2014 | Hsieh | ........ | H01L 33/46 |
| | | | | 257/98 |
| 2014/0168572 A1* | 6/2014 | Iwata | ........ | H01L 51/5268 |
| | | | | 349/61 |
| 2014/0367633 A1* | 12/2014 | Bibl | ........ | G02F 1/133603 |
| | | | | 257/13 |
| 2017/0229607 A1* | 8/2017 | Odnoblyudov | ........ | H01L 33/22 |
| 2018/0031188 A1* | 2/2018 | Sharrah | ........ | F21K 9/90 |
| 2018/0112850 A1* | 4/2018 | Van Bommel | ........ | F21V 9/08 |

\* cited by examiner

LED GROW LIGHT SYSTEM

BACKGROUND OF THE INVENTION

The present invention generally relates to a light emitting diode ("LED") grow light system. More specifically, the present invention relates to an LED grow light system including an LED having a filter substrate and/or a filter coating thereon for at least partially reflecting and/or absorbing blue light spectra to mimic a High Pressure Sodium ("HPS") comparable light spectrum for deployment as a replacement plant grow light.

In the last several decades, High Pressure Sodium ("HPS") lamps have been used extensively as plant grow lights for indoor plant growing systems and are proven to be some of the best available artificial lighting systems for plant growth. HPS lamps are particularly conducive for use in plant growing systems because of the relatively high output intensity within certain visible light spectrums, their relatively low price, long life, high photo-synthetically active radiation ("PAR") emission, and high electrical efficiency. Although, one drawback is that HPS lamps are not necessarily optimal for promoting photosynthesis and photomorphogenesis. For example, FIG. 1 is an HPS light spectrum graph 20 illustrating the relative intensities of visible light emitted from an HPS lamp. As shown, the HPS lamp has an energy intensity that is strongest around the orange-red part of the spectrum (i.e., at wavelengths of about 580-620 nanometers ("nm")). Such strong light intensities in this range tend to stimulate plant hormones to start budding and flowering, but do not necessarily promote desired growth. Thus, one disadvantage is that continued exposure to such high intensities in the orange-red part of the spectrum (i.e., wavelengths of about 580-620 nm) can result in excessive leaf and stem elongation due to the unbalanced spectral emission intensity from the HPS lamp in this range, and especially relative to other absorption peaks of the plant. Thus, while HPS lamps have been widely used, plant growth under HPS lamps may be less than optimal.

In recent years, LED lighting technology has matured within the lighting industry such that advancements in LED architecture have resulted in significantly reducing manufacturing costs, increasing LED efficiency, and creating an overall more robust LED light design better suited for use in plant grow light systems. In this respect, it may now be feasible to replace HPS lamp-based plant grow light systems with LED-based plant grow light systems in the horticulture business to lower the Total Cost of Ownership ("TCO"), such as lowering the cost of electricity (i.e., LEDs tend to be more energy efficient than HPS lamps), lowering the cost of air conditioning (i.e., LEDs tend to generate less heat than HPS lamps), lowering the cost of the lamps themselves, and increasing lamp longevity (i.e., decreasing the replacement rate in view that LEDs have a longer projected lifespan). Although, one major drawback of using LEDs as a plant grow light is that the spectrum of the LED output is different than the output of HPS lamp. For example, LED grow light designs manufactured specifically for the horticulture market use blue LEDs (e.g., at wavelengths of about 420-480 nm) and red LEDs (e.g., at wavelengths of about 620-780 nm). To this end, the green spectrum (e.g., at wavelengths of about 500-580 nm) is commonly omitted from LED plant grow lights since the belief within the industry is that green leaves reflect green light and, therefore, the green spectrum is not absorbed by the plant and consequently unnecessary. Thus, important aspects of robust plant growth are lost since wavelengths between the blue spectrum and red spectrum (e.g., within the green or yellow spectrums) are disregarded and commonly omitted from LED grow lights. HPS lamps, on the other hand, have relatively stronger (yet not optimal) green spectrum intensities in the 500-580 nm wavelength range as shown, e.g., in FIG. 1. Although, HPS lamps are more expensive and have a relatively shorter life when compared to LED lights, and HPS lamps are also not necessarily environmentally friendly because they contain mercury, and, importantly, the spectrum of the HPS lamp cannot be tailored to meet the various spectral needs of different plants.

One benefit of an LED grow light is that there are a wide number of available LEDs that generate light output at custom wavelengths. Although, mimicking the HPS lamp in an LED grow light is not as simple as aggregating several differently colored industry standard LEDs having different light output wavelengths because the resultant spectrum is not exactly similar to that of the HPS lamp light spectrum graph 20 illustrated with respect to FIG. 1. For example, FIG. 2 is a tri-LED light spectrum graph 22 illustrating the relative radiant power of three off-the-shelf LEDs having different color temperatures ("CCT") and different color rendering indices ("CRI"). As shown, even the lowest 2,200K CCT LED does not have a spectrum that matches the HPS lamp light spectrum graph 20 as closely in intensity in the blue spectrum (e.g., at wavelengths of about 420-480 nm)—the relative radiant power intensity is too high. It becomes necessary to either increase the amount of the orange/red light (e.g., at wavelengths of about 580-620 nm) to compensate for the relatively high intensity in the blue spectrum or decrease the amount of blue light so the LED light output is similar to that of the HPS lamp. Continuing to lower the CCT of the LED further lowers the amount of blue light, but at a penalty in lowering the efficiency of the LED. Thus, current LEDs known in the art are ineffective in grow light applications, especially when compared to HPS lamps.

In another example, FIG. 3 illustrates an octo-LED light spectrum graph 24 illustrating the relative radiant power of eight standard off-the-shelf LEDs, each with a different center light output wavelength. Here, to add more of the orange/red spectrum to the LED lighting system, additional LEDs that emit output light in more of the amber, orange/red, and/or red spectrum may be added to help better mimic the spectrum of that of the HPS lamp. This is accomplished chiefly by increasing the output intensity of the LEDs having the orange/red wavelengths, such as relative to the blue spectrum light output. Even so, each of the LEDs produces sharp peaks uncharacteristic of the HPS lamp light spectrum graph 20 and natural light, thus producing less than optimal plant growth results.

Other more recent LED plant grow light technologies claim to generate light at wavelengths all along the visible color spectrum under computer control (as needed), but these grow light systems still fail to emphasize the importance of the relative intensities of the HPS lamp output spectrum, such as shown with respect to FIG. 1. Thus, the potential benefits of using LEDs as a replacement for HPS lamps (e.g., lower cost and higher efficiency) for use as a plant grow light has yet to be achieved in the horticulture industry. While there are numerous studies currently underway examining the effects of wavelengths on plant growth, those features are still in the experimental stages and many benefits are still unknown. Thus, adoption rate in the industry may be slow. Relatively smaller growers may begin using LEDs as plant grow lights as early adopters to try and benefit from reductions in TCO; although such small growers are still burdened with the changes during the growth cycle of the plants. That is, the growers must make adjustments in the light spectrum during the plant growth cycle, and sometimes such adjustments fail. Relatively larger-scale growers have generally avoided such risk. Thus, industry wide transition from HPS lamp systems to LED lamp-based systems for use as plant grow lights has taken some time.

There exists, therefore, a significant need in the art for an LED grow light system suitable as a replacement of for an HPS lamp, wherein such an LED grow light system includes and LED having a phosphor layer positioned underneath a filter substrate or filter coating having reflective or absorptive properties limiting the output of blue spectra on par with an HPS lamp and emphasizing emission of intermediate spectra in the green/yellow spectra range to enhance plant growth. Such an LED grow light system should be readily interchangeable with the HPS lamp to promote industry wide adoption. The present invention fulfills these needs and provides further related advantages.

SUMMARY OF THE INVENTION

In one embodiment, an LED grow light system as disclosed herein includes an LED coupled to a circuit board, a phosphor layer generally positioned at least partially over the LED coupled to the circuit board, and a filter positioned in light receiving relation relative to the LED coupled to the circuit board and in light reflective relation relative to the phosphor layer. The filter may include a material at least partially reflective of at least a first light output wavelength emitted from the LED for redirection back into the phosphor layer where the reflected first light output wavelength converts to a second light output wavelength for recycled emission out from the LED grow light system as a composite light output component that includes a mixture of the first light output wavelength and the second light output wavelength. As such, recycling may allow for the LED grow light system to custom tailor emission of certain wavelengths at certain desired intensities through the plant growth cycle without losing light energy generation to absorption.

Here, the second light output wavelength may include a different wavelength than the first light output wavelength. For example, in an embodiment wherein the LED includes a blue LED, the first light output wavelength may include a plurality of wavelengths within a blue spectra (e.g., at wavelengths between about 420-480 nm). Additionally, the phosphor layer may include a yellow phosphor and the second light output wavelength may include a plurality of wavelengths in a yellow spectra (e.g., at wavelengths between about 560-600 nm). Here, the first light output wavelength emitted from the LED grow light system as part of the composite light output component may include an intensity relatively lower than the first light output wavelength emitted from the LED and the second light output wavelength emitted from the LED grow light system as part of the composite light output component may include an intensity relatively higher than the second light output wavelength emitted from the LED. This is because some of the first light output wavelength is being reflected back on to the phosphor layer for conversion to the second light output wavelength. As such, the LED grow light system is able to recycle light output at different wavelengths to alter the emitted intensity. Such a system is also more efficient in that certain wavelengths with lower desired intensities are recycled into other wavelengths with higher desired intensities as opposed to being absorbed and otherwise lost during light generation.

In another aspect of the embodiments disclosed herein, an adhesive may selectively secure the filter to the phosphor layer. Moreover, the filter may include a surface area coextensive with the phosphor layer and may be at least partially opaque and include a 90%-99% reflective rate. More specifically, the filter may include a filter substrate having a filter coating on an external surface area opposite the adhesive. In one embodiment, the filter substrate may include a generally transparent material and the filter coating may include the reflective material. In another embodiment, the filter coating may include a surface area less than coextensive with the filter substrate. Additionally, the adhesive may include a reflective transparent glue, the filter substrate may reflect a different wavelength than the filter coating, and the filter substrate may permit pass-through of a different wavelength than the filter coating.

In an alternative embodiment, the filter may include a filter cup that couples to a vertical support and is generally positioned above the LED in non-contact relation relative thereto and cooperates with the circuit board to encapsulate the LED therein. The filter cup may adhesively couple to the vertical support, and the vertical support may then adhesively couple to the circuit board to generally encase or encompass the underlying LED. In this embodiment, a filter coating may couple to an interior surface of the filter cup.

In another aspect of the embodiments disclosed herein, the circuit board may include multiple of the LEDs coupled thereto and the filter may include a filter substrate having a plurality of filter coatings thereon and generally discretely aligned with each of the multiple LEDs coupled with the circuit board. In one embodiment, at least two of the plurality of the filter coatings includes a different material composition. Alternatively, the filter substrate may include a single filter coating generally coextensive therewith.

The LED grow light system may include a flat grow light or a domed grow light. In embodiments wherein the LED grow light system is the domed grow light, an adhesive may be disposed along an exterior arcuate curvature of the domed grow light to generally form a horizontal platform for select adhesive coupling with the filter. This may permit the adhesive filter to be disposed above the LED thereunder, despite the curved or domed nature of the exterior of the domed grow light.

In another embodiment, the circuit board may include a universal connector for selectively coupling the LED grow light system with an HPS lamp socket. Additionally, the LED may include multiple LEDs that include a yellow LED, a green LED, an orange LED, and/or a red LED. These multi-color LEDs may be formed as part of multiple discrete LED grow light systems coupled to the circuit board such that each discrete LED grow light system includes LEDs that vary in color. Here, a controller may regulate operation of each of the plurality of discrete LED grow light systems in real-time, such as at various stages of the plant growth cycle.

To mimic the output spectrum of the HPS lamp, the composite light output component of the LED grow light as disclosed herein may include a green spectrum intensity of 10%-40% at wavelengths of about 500-570 nm, a yellow spectrum intensity of 60%-90% at wavelengths of about 570-600 nm, a blue spectrum intensity of 0%-20% at wavelengths of about 420-480 nm, an orange spectrum intensity of 55%-100% at wavelengths of about 600-620 nm, a red spectrum intensity of 10%-50% at wavelengths of about 620-700 nm, and a deep red spectrum of 5%-20% intensity at wavelengths of about 700-780 nm.

Other features and advantages of the present invention will become apparent from the following more detailed description, when taken in conjunction with the accompanying drawings, which illustrate, by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENTS

Figure 1:
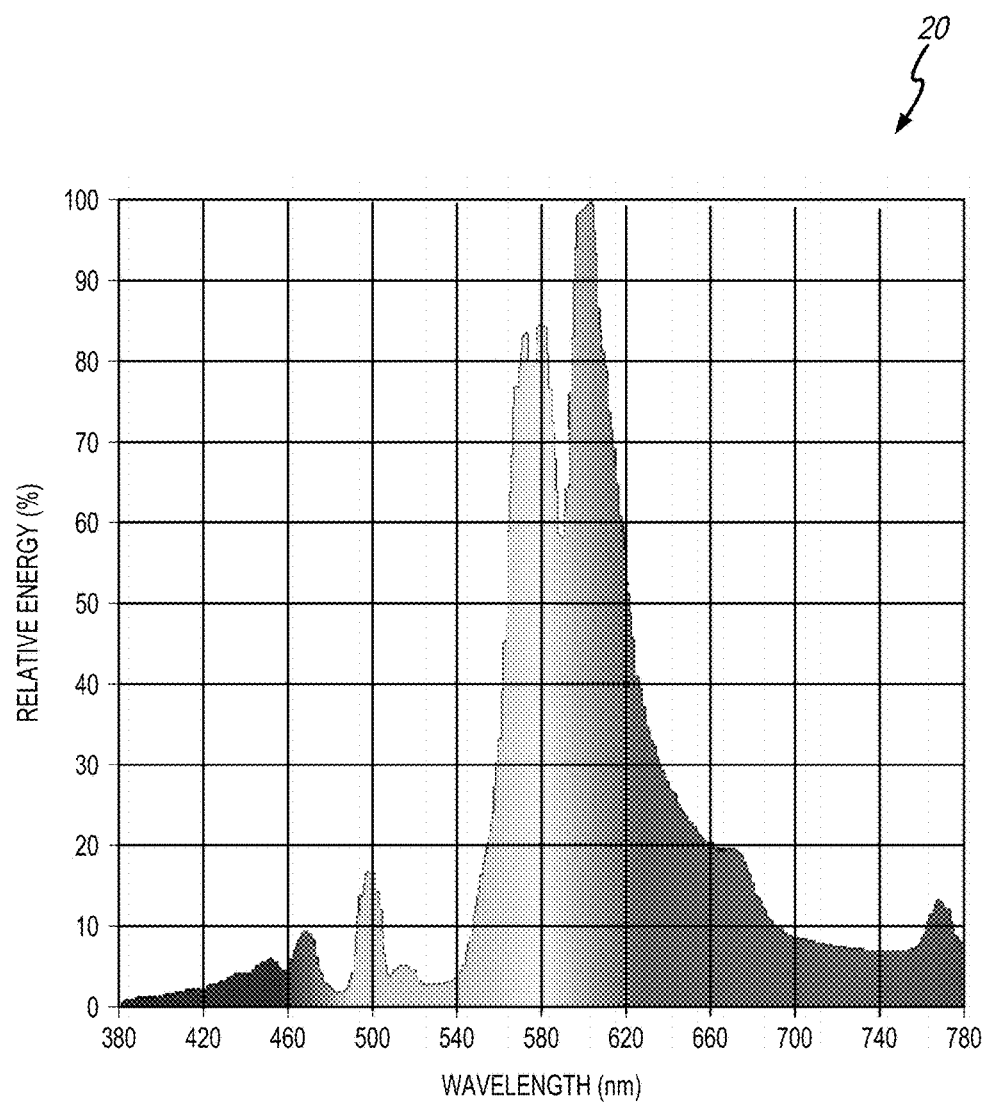
FIG. 1 is an HPS lamp light spectrum graph illustrating variations in relative energy of light output of an HPS lamp at wavelengths between 380 nm and 780 nm.

As shown in the exemplary drawings for purposes of illustration, the present invention for an LED grow light system with an HPS lamp light emitting spectrum is generally referred to by the reference numerals 26-26''' in FIGS. 6-11. In general, each of the LED grow light systems 26-26''' as disclosed herein are designed to at least mimic the output spectrum and power intensities of traditional HPS lamps used as plant grow lights. For example, the operation and growth cycle of the LED grow light systems 26-26''' may be able to produce a spectrum closely related to HPS lamp-based grow light systems as represented in the HPS lamp light spectrum graph 20 of FIG. 1, and may even be able to generate more optimal output light intensities in the green spectrum (e.g., at wavelengths of about 500-570 nm) and the yellow spectrum (e.g., at wavelengths of about 570-600 nm), as disclosed in more detail herein.

In one embodiment, each of the LED grow light systems 26-26''' may include a universal connector (or specific HPS lamp connector) that facilitates plug-and-play replacement of HPS lamps in current grow light systems. Here, growers may be able to simply change out the "old" HPS lamps with the "new" LED grow light systems 26-26''' having relatively the same intensity and spectrum, as discussed in more detail below. This may allow horticulture businesses to immediately capture the benefits of the LED grow light systems 26-26''' in current plant glow light setups.

At the same time, incorporation of one or more of the LED grow light systems 26-26''' may provide additional features such as the addition of specific light output with spectrum(s) tailored for specific types of plants or specific stages in the growth cycle. Growers can then capitalize on the capabilities of the LED grow light systems 26-26''' immediately by replacing HPS lamps, and retain the flexibility of improving the growing process over time. Accordingly, as indicated above, the utility cost for lamps and air conditioning will be relatively lower since the LED grow light systems 26-26''' require relatively less electricity to generate the same or similar light output and intensity, generate relatively less heat, thereby decreasing the amount of energy needed to run related air conditioning systems to maintain the ambient temperature at a desirable temperature for plant growth (especially for indoor growing applications), and are relatively less expensive to manufacture and last longer than HPS lamps. Thus, decreased operating costs will help pay for the transition from HPS lamps to the LED grow light systems 26-26''' and also decrease long-term TCO, which may reduce product costs and/or increase long-term profit margins.

As briefly mentioned above, FIG. 1 is an HPS lamp light spectrum graph 20 illustrating variations in relative energy of light output emitted by an HPS lamp at wavelengths between 380 nm and 780 nm. As shown, the majority of the light output is in the orange-red spectrum (i.e., at wavelengths of about 580-620 nm) with a relatively small amount of light output in the blue spectrum (i.e., at wavelengths of about 420-480 nm) and the deep red spectrum (i.e., at wavelengths of about 700-780 nm). Successful deployment of HPS lamps in plant grow light systems in the last several decades indicates that output light only in the blue spectrum (e.g., at wavelengths between about 420-480 nm) and deep red spectrum (e.g., at wavelengths between about 700-780 nm) is not as effective as may be desired to spur plant growth. Thus, while in one embodiment, the LED grow light systems 26-26''' are designed to at least mimic the light output spectrum of HPS lamps, other embodiments of the LED grow light systems 26-26''' may enhance plant growth by enhancing the intensity of light output at other wavelengths (e.g., the yellow and/or green spectrums).

Figure 2:
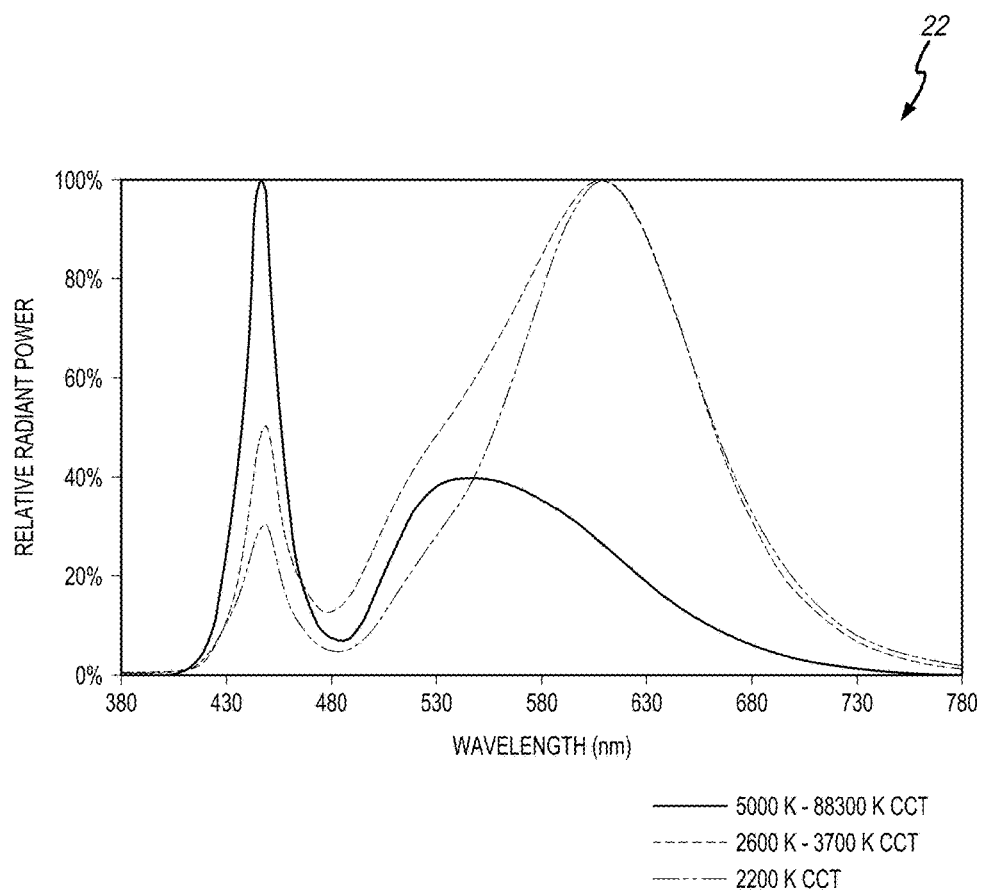
FIG. 2 is a tri-LED light spectrum graph illustrating variations in relative radiant power of light output at wavelengths between 380 nm and 780 nm for a set of three LEDs having different color temperature and color rendering indices, the combination of which produces a spectrum closer to that of the HPS lamp light spectrum graph of FIG. 1.
Figure 4:
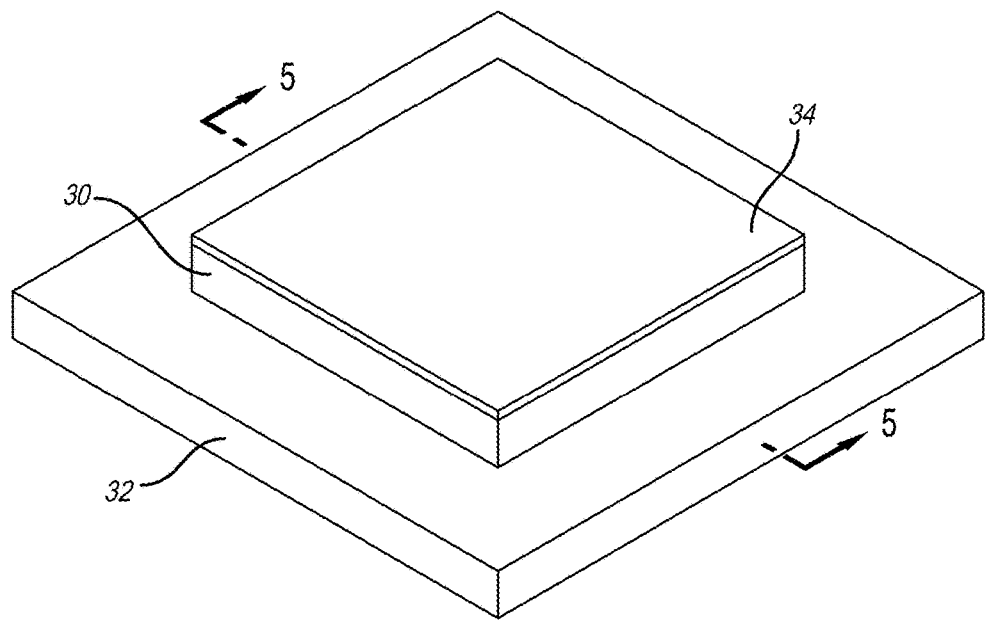
FIG. 4 is a perspective view of a prior art LED having a relatively flat profile.
Figure 5:
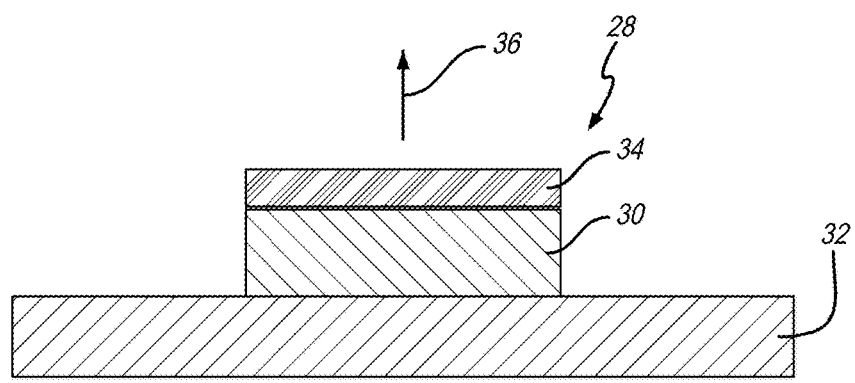
FIG. 5 is a cross-sectional view taken about the line 5-5 of the prior art LED of FIG. 4.

FIG. 4 illustrates a standard blue LED 30 having a size, shape, and structure of a generally flat profile LED as may be standard or known in the art; and FIG. 5 is a cross-sectional view of the standard blue LED 30, taken about the line 5-5 in FIG. 4. More specifically, each of FIGS. 4 and 5 illustrate the standard blue LED 30 coupled to a circuit board 32 on one side and including a yellow phosphor layer 34 on an opposite (light output) side. When the standard blue LED 32 generates light within the blue spectrum (e.g., at wavelengths of about 420-480 nm), it may be excited by the yellow phosphor layer 36 and emitted as light output (indicated by an arrow 36 in FIG. 5) having visible light having wavelengths such as those illustrated with respect to the 5000 k-88300 k CCT LED in FIG. 2. Thus, deploying 5000 k-88300 k CCT LEDs having the relative radiant power characteristics at the wavelengths illustrated in FIG. 2 in plant grow light systems are generally inefficient in plant growth development, as discussed above.

Figure 6:
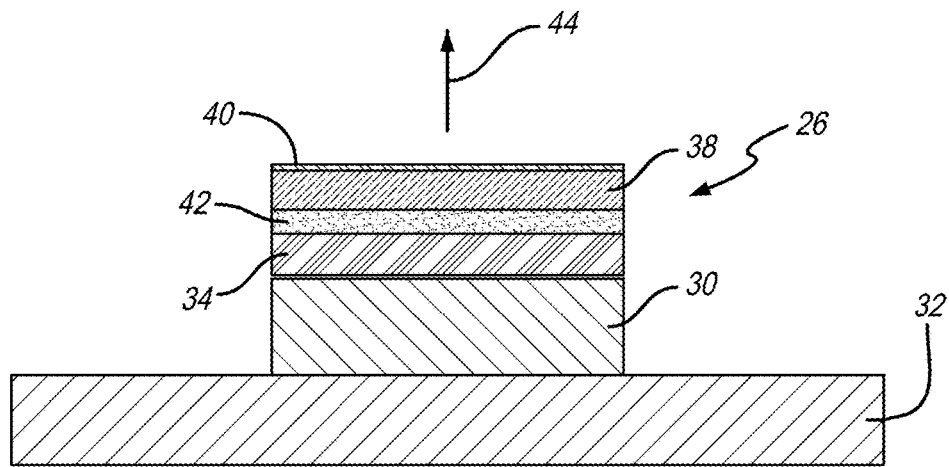
FIG. 6 is a cross-sectional view similar to FIG. 5, illustrating one embodiment of an LED grow light system as disclosed herein for producing an HPS lamp comparable light spectrum.

Accordingly, FIG. 6 illustrates one embodiment of the LED grow light system 26 with the standard blue LED 30 and the corresponding phosphor layer 34 generally positioned under or otherwise enclosed or encased (FIG. 8) by a filter substrate 38 having a filter coating 40. In the embodiment illustrated with respect to FIG. 6, the filter substrate 38 may attach to an external side of the phosphor layer 34 by an adhesive 42 such as transparent glue or the like. When used with the underlying standard blue LED 30, the filter substrate 38 and/or the filter coating 40 may reduce blue light emissions of the LED grow light system 26 from the relative radiant power intensities shown in FIG. 2 with respect to the tri-LED light spectrum graph 22 to levels closer to the HPS lamp light spectrum graph 20 illustrated in FIG. 1. The filter substrate 38 may be used alone and/or in cooperation with the filter coating 40 to modify the output light spectrum emitted from the LED grow light system 26. For example, in one embodiment, the filter substrate 38 may reflect certain light output wavelengths (e.g., in the blue spectrum) generated by the standard blue LED 30 while simultaneously permitting pass-through of other light output wavelengths. Similarly, the filter coating 40 may also reflect certain light output wavelengths generated by the standard blue LED 30 while simultaneously permitting pass-through of other light output wavelengths. In embodiments wherein both the filter substrate 38 and the filter coating 40 are used, each of the filter substrate 38 and the filter coating 40 may reflect the same or different wavelengths, and may permit pass-through of the same or other light output wavelengths. This way, the LED grow light system 26 can regulate the types of wavelengths emitted from the LED grow light system 26 and the relative intensities thereof to optimize plant growth over the lifecycle of the plant. Additionally, or alternatively, the filter substrate 38 and/or the filter coating 40 may also absorb (as opposed to reflect) certain light output wavelengths that may be undesirable for use during the entire or a portion of the lifecycle of the plant growth, although absorption may be less preferred as it may decrease the efficiency of the LED grow light system 26.

In one aspect of this embodiment, the filter substrate 38 may generally include a surface area coextensive with the surface area of the underlying phosphor layer 34, i.e., the emission area of the underlying standard blue LED 30. Although, depending on the amount of blue light reduction from the underlying standard blue LED 30, the filter substrate 38 may include a surface area that is less than coextensive with the surface area of the underlying phosphor layer 34. Here, the relative surface area of the filter substrate 38 may at least partially determine the blue light intensity emitted from the LED grow light system 26. Accordingly, it may be possible to achieve specific (desired) light output intensities in the blue spectrum (e.g., at wavelengths of about 420-480 nm).

Similarly, in another embodiment, the filter coating 40 may generally include a surface area coextensive with the surface area of the underlying filter substrate 38, and may otherwise be coextensive with the light emitted by the underlying standard blue LED 30. Although, depending on the amount of blue light reduction from the underlying standard blue LED 30, the filter coating 40 may include a surface area less than coextensive with the surface area of the underlying filter substrate 38. Here, the relative surface area of the filter coating 40 may at least partially determine the blue light intensity emitted from the LED grow light system 26 alone or in combination with the filter substrate 38. Accordingly, it may be possible to achieve more highly specific and desired light output intensities in the blue spectrum (e.g., at wavelengths of about 420-480 nm) through concurrent use of the filter substrate 38 and/or the filter coating 40.

Figure 3:
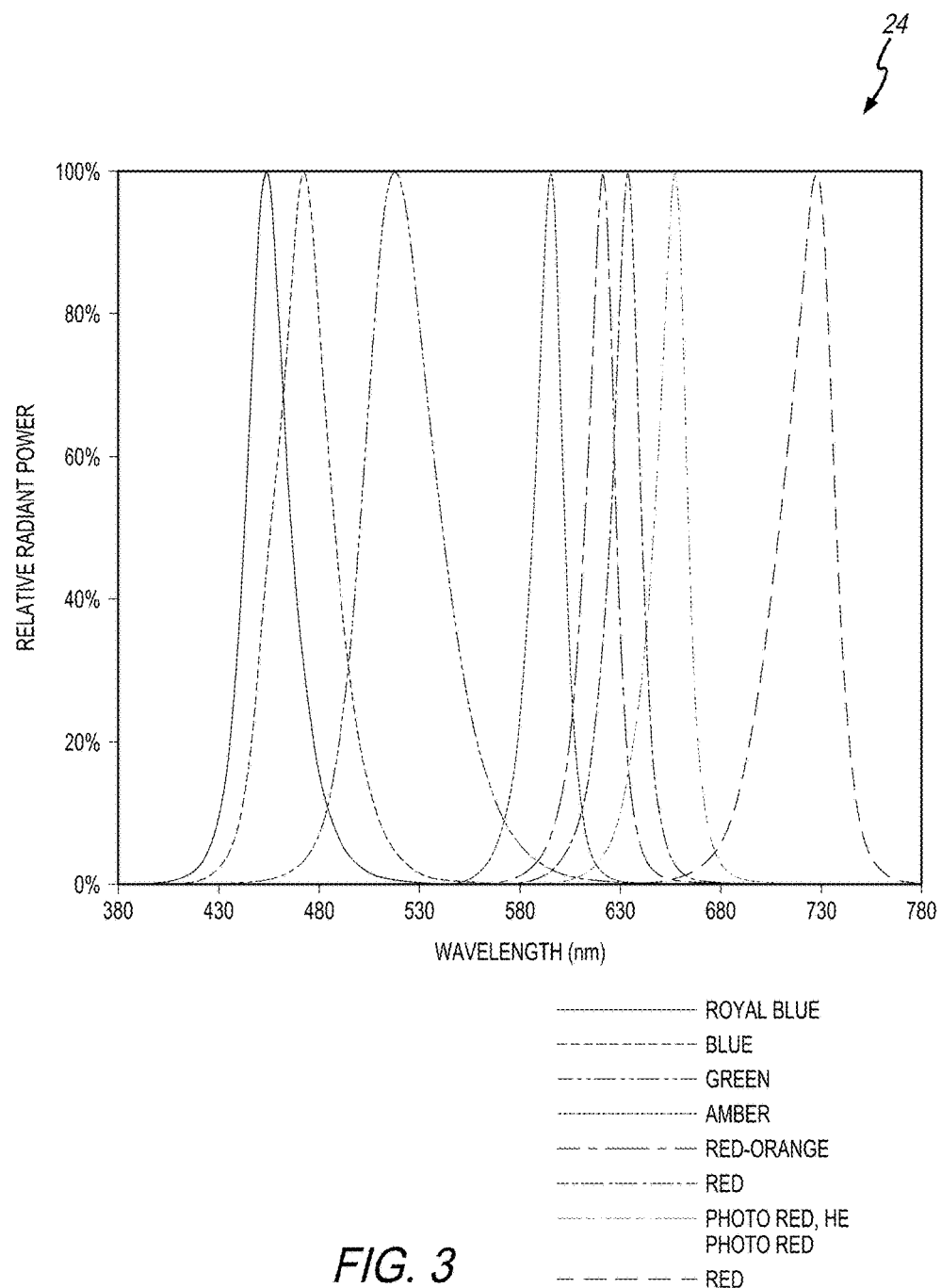
FIG. 3 is an octo-LED light spectrum graph illustrating variations in relative radiant power of light output at wavelengths between 380 nm and 780 nm emitted for a set of eight LEDs having different color temperature and color rendering indices, including in an orange/red light spectrum, the combination of which produces a more complete spectrum than that of the HPS lamp light spectrum graph of FIG. 1 and the tri-LED light spectrum graph of FIG. 2 yet at higher than desired intensities optimal for plant growth.

The filter substrate 38 and/or the filter coating 40 may vary from substantially transparent to substantially opaque, depending on the desired transmission of spectra out from the LED grow light system 26. For example, the filter substrate 38 and/or the filter coating 40 may include a material that substantially reflects (e.g., upwards of 90%-99% reflection) light emitted from the standard blue LED 30. Alternatively, the filter substrate 38 and/or the filter coating 40 may partially reflect light emitted from the standard blue LED 30 through use of various materials and/or coating designs (e.g., as low as nearly 1%-10%). To this end, the filter substrate 38 and/or the filter coating 40 may similarly be configured to regulate and/or adjust the amount of blue light reduction emitted from the LED grow light system 26 such that the intensity within the blue spectra (e.g., at wavelengths of about 420-480 nm) is closer to that shown with respect to the HPS lamp light spectrum graph 20 in FIG. 1, as opposed to the tri-LED light spectrum graph 22 in FIG. 2 or the octo-LED light spectrum graph 24 in FIG. 3.

In another embodiment, the adhesive 42 may include a transparent glue material with proper adhesive properties that generally non-removably couple the filter substrate 38 to the phosphor layer 34. The adhesive 42 may include silicone, polyurethane, etc. and may be transparent for substantial pass-through of light output from the standard blue LED 30. Alternatively, the adhesive 42 may include reflective and/or absorptive properties to further fine-tune the spectra emitted from the LED grow light system 26 for purposes of optimizing plant growth in applications where the LED grow light system 26 is used as a plant grow light.

Figure 7:
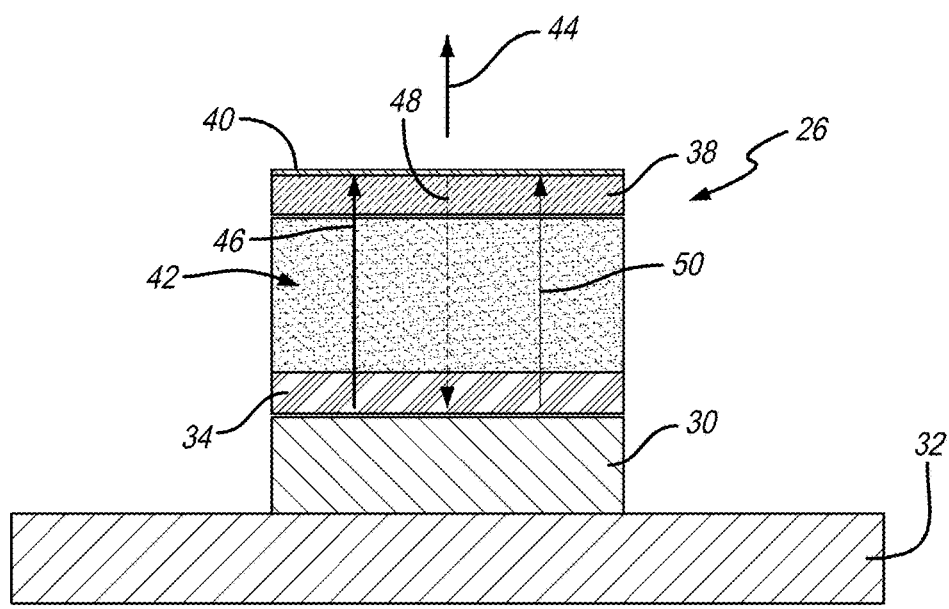
FIG. 7 is a cross-sectional view of the LED grow light system similar to FIG. 6, further illustrating a filter substrate and a filter coating in exploded relation over an underlying LED to highlight reflection of secondary yellow light emissions therein.

In general, FIGS. 6 and 7 illustrate that light exiting the LED grow light system 26 includes a combination blue/yellow light output component 44, i.e., a mixture of blue and yellow spectra. Importantly, and further to the above, the intensity of blue light emitted from the LED grow light system 26 may be relatively lower than if the standard blue LED 30 emitted light only through the phosphor layer 34, as known in the art. That is, as discussed above, the filter substrate 38, the filter coating 40, and/or the adhesive 42 may provide at least partial reflection of light emitted from the standard blue LED 30 so the LED grow light system 26 may attain the desired intensities along the visible light spectrum to help facilitate plant growth relative to an unfiltered standard blue LED 30.

FIG. 7 is a cross-sectional view similar to FIG. 6, except that the reflective aspect of the filter substrate 38 and the overlying filter coating 40 is exemplified through the adhesive 42 (i.e., the adhesive 42 has been stretched out between the phosphor layer 34 and the filter substrate 38). As illustrated in FIG. 7, initial light output from the phosphor layer 34 may have a substantially blue light component 46. In some embodiments, a portion of the blue light component 46 may be permitted to travel through the adhesive 42, through the filter substrate 38, and through the filter coating 40 for emission as part of the combination blue/yellow light output component 44. The other portion of the blue light component 46 may be reflected and/or absorbed by one or more of the adhesive 42, the filter substrate 38, and/or the filter coating 40. In the embodiment illustrated with respect to FIG. 7, the blue light component 46 passes through the adhesive 42 and the filter substrate 38 where the blue light component 46 is at least partially reflected off the filter coating 40 for return back to the phosphor layer 34 as a reflective light component 48. Of course, in alternative embodiments, the adhesive 42 and/or the filter substrate 38 may also, or instead of, at least partially reflect the blue light component 46 back down toward the phosphor layer 34 as the reflective light component 48.

The reflective light component 48 will re-excite the phosphor layer 34 to generate additional "yellow" light from the LED grow light system 26 in the form of a secondary yellow light emission component 50 as illustrated in FIG. 7. On one hand, such reflections decreases the output of blue light (i.e., at wavelengths of about 420-480 nm) and increases the amount of yellow light (i.e., at wavelengths of about 550-600 nm). Thus, the combination blue/yellow light output component 44 includes light output in the blue spectrum having lower intensities than the standard blue LED 30; and includes light output in the yellow spectrum having higher intensity on par with an HPS lamp. The combination blue/yellow light output component 44 may even include higher intensity green spectra relative to the HPS lamp.

Of course, the relative amount of light output in the blue spectrum and/or the yellow spectrum may be adjusted by altering the material characteristics of the filter substrate 38, the filter coating 40, and/or the adhesive 42 to attain the desired amount of blue light transmission and/or reflection. The use of the filter substrate 38, the filter coating 40, and/or the adhesive 42 having reflective properties (as opposed to absorptive properties) allows for the reuse of unwanted light output in the blue spectrum. In the embodiments disclosed herein, when used in combination with the phosphor layer 34, it may be possible to use this recycled light output from the blue spectrum (i.e., the reflective light component 48) to enhance the intensity of yellow light emitted from the LED grow light system 26. This, in turn, may increase the efficiency of the LED grow light system 26 since less light is lost due to absorption and, especially, relative to HPS lamps.

In general, one or more of the filter substrate 38, the filter coating 40, and/or the adhesive 42 may be designed to include reflective and/or absorptive properties to regulate the intensity and type of wavelength emitted from the LED grow light system 26. In one embodiment, the filter substrate 38, the filter coating 40, and/or the adhesive 42 may reflect and/or absorb blue light emitted from the standard blue LED 30 to reduce the amount of output light in the blue spectra. Based on the output spectrum of the standard blue LED 30, the spectral filtering properties of the filter substrate 38, the filter coating 40, and/or the adhesive 42 can be designed such that the output of the LED grow light system 26 more closely matches HPS lamp output spectrum, especially wherein the filter substrate 38, the filter coating 40, and/or the adhesive 42 reflect and/or absorb the blue spectra to diminish its output intensity.

There may be different embodiments wherein the desired output spectra may be attained by reflecting and/or filtering light output from the standard blue LED 30 having the phosphor layer 34 thereon, such as with altering the position of the location of the filter substrate 38 and/or the filter coating 40 in relation to the standard blue LED 30 and the phosphor layer 34, to attain the desired reflection and/or absorption of light output from the LED substrate 32 for fine-tuning the desired spectra emitted from the LED grow light system 26 as disclosed herein.

Figure 11:
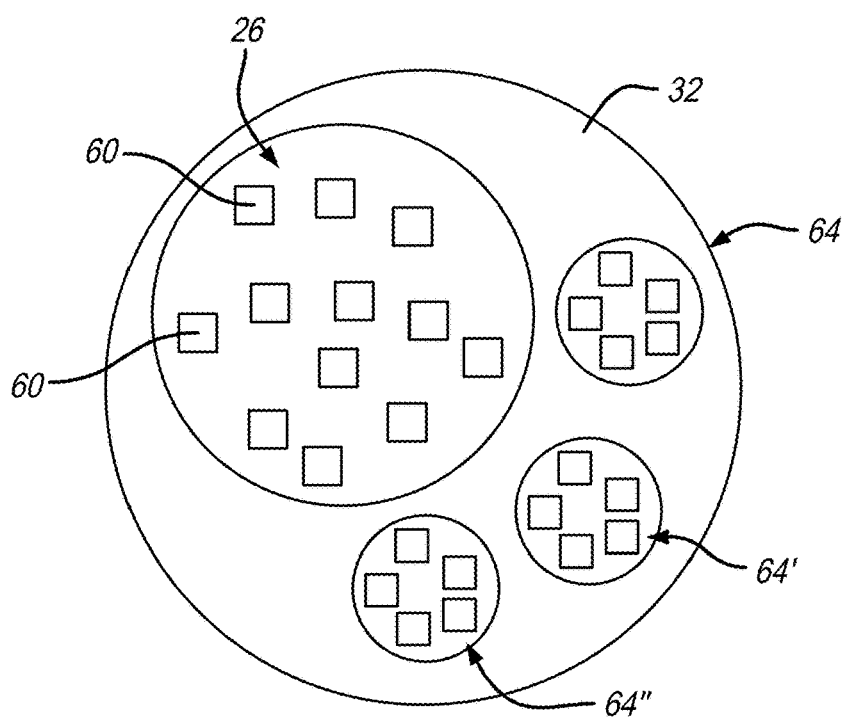
FIG. 11 is a top plan view of another alternative embodiment of an LED grow light according to the embodiments disclosed herein.

Of course, as disclosed herein, the standard blue LED 30 could be replaced with LEDs that emit light at other wavelengths, such as within the yellow, green, orange, red, and/or deep red spectrums. The filter substrate 38, the filter coating 40, and/or the adhesive 42 may then be tuned to reflect certain wavelengths depending on the color spectrum LED used and the desirable output wavelength and intensity. Additionally, in multiple LED embodiments, e.g., as shown in FIGS. 9 and 11, a single circuit board 32 may include LEDs that vary in color emission; and the filter substrate 38, the filter coating 40, and/or the adhesive 42 may include reflection and/or absorption properties specific to the color of the underlying LED.

Figure 8:
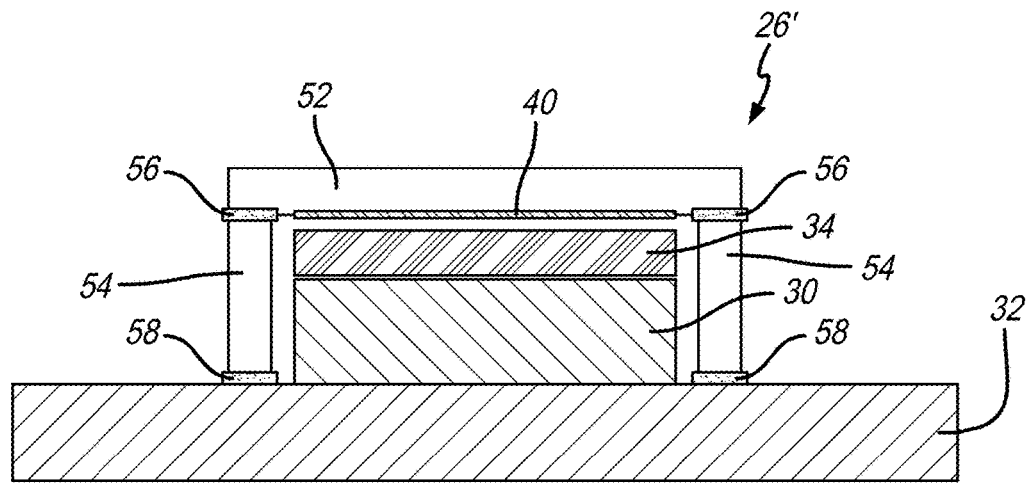
FIG. 8 a cross-sectional view similar to FIG. 6, illustrating an alternative embodiment of the LED grow light system as disclosed herein having a filter cap coupled to the circuit board and generally disposed over the underlying LED.

FIG. 8 illustrates an alternative embodiment of an LED grow light system 26' having the standard blue LED 30 with the phosphor layer 34 disposed thereon coupled to the circuit board 32, as discussed above. Although, in this embodiment, the filter coating 40 is coupled to an internal side of a filter cup 52 generally positioned above and otherwise generally encasing or enclosing the standard blue LED 30 and the phosphor layer 34 thereunder in cooperation with the circuit board 34. In this respect, as illustrated in FIG. 8, the filter cup 52 may couple to a pair of vertical supports 54 by way of an upper adhesive 56; and the filter cup 52 may adhere to the circuit board 32 by way of a lower adhesive 58. In this embodiment, instead of adhering the filter substrate 38 directly to the phosphor layer 34 with the adhesive 42 (FIGS. 6-7), the standard blue LED 30 and the phosphor layer 34 are generally enclosed by the upstanding vertical supports 54 and the generally horizontally extending filter cup 52 with the filter coating 40 disposed thereunder and generally at least partially coextensively or entirely coextensively extending over the surface area of the phosphor layer 34. In this embodiment, the reflective and/or absorptive filter coating 40 is not adhered directly to the phosphor layer 34.

Figure 9:
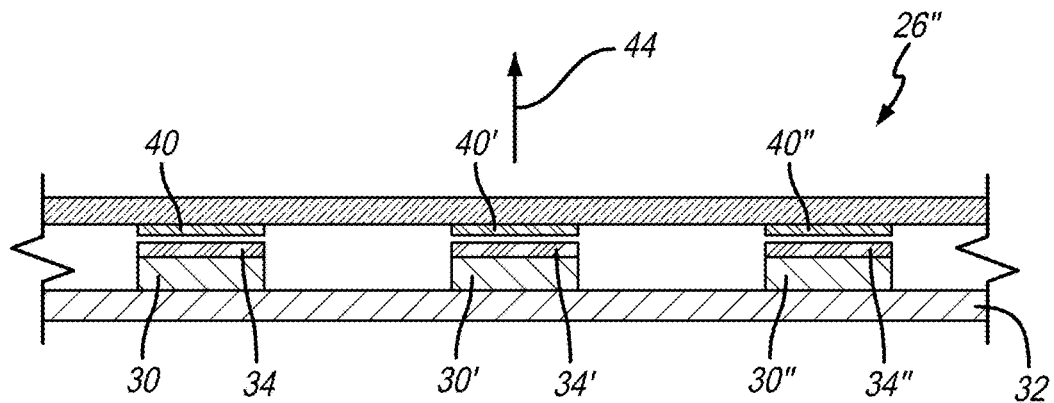
FIG. 9 is a cross-sectional view similar to FIGS. 6 and 8, further illustrating an alternative LED grow light system incorporating multiple LEDs underlying a filter substrate having discretely positioned interiorly positioned filter coatings.

For larger installations, the circuit board 32 may have a surface area sized to accommodate multiple of the standard blue LEDs 30 having the phosphor layers 34 thereon, such as illustrated in FIG. 9 with respect to an LED grow light system 26" having the standard blue LEDs 30, 30', 30" and the phosphor layers 34, 34', 34". Moreover, the filter substrate 38 in this embodiment may include multiple of the filter coatings 40, 40', 40" disposed thereunder (as opposed to thereover in FIGS. 6-7) and generally aligned with each of the standard blue LEDs 30, 30', 30" and the respective phosphor layers 34, 34, 34". In the event that the LEDs 30, 30', 30" vary in color, the corresponding filter coatings 40, 40', 40" may include material properties designed to reflect the specific color of the underlying LED 30, 30', 30", depending on the desired output intensities of those wavelengths. For example, the LED 30 may be a standard blue LED and the corresponding filter coating 40 may include material properties specific to reflecting blue spectrum wavelengths. Additionally in this respect, the LED 30' may be a standard red LED and the corresponding filter coating 40' may include material properties specific to reflecting red spectrum wavelengths.

In one embodiment, the filter coating 40 may be disposed generally coextensively underneath the entire filter cup 52 to maximize light reflection and/or absorption in accordance with the embodiments as disclosed herein. This larger LED grow light system 26" may be separately usable with lamp fixtures and can also act as a cover for a lamp system. When reflectors and/or filters such as the filter coating 40, 40', 40" are used, instead of using only LEDs with 3,000K CCT LEDs, higher CCT LEDs can also be used with increased blue light filtering, while producing output light having a more closely matching spectrum to an HPS lamp spectrum.

Figure 10:
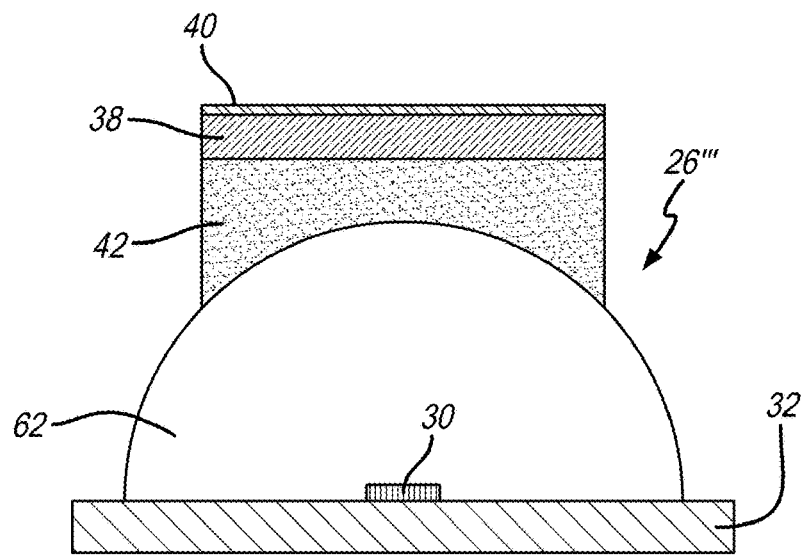
FIG. 10 is a side view illustrating a dome-shaped LED grow light system as disclosed herein.

FIG. 10 illustrates another embodiment of a dome-based LED grow light system 26'''. In this embodiment, the standard blue LED 30 couples to the circuit board 32 that includes a transparent dome lens 62 coupled thereto. Here, the adhesive 42 may be disposed about a portion of the generally arcuately configured dome lens 62. As illustrated in FIG. 10, the adhesive 42 may conform to the outer arcuate shape of the dome lens 62 to provide a base to which the generally horizontally positioned filter substrate 38 may attach. Thus, the filter substrate 38 with the filter coating 40 disposed on an exterior surface area thereof may generally be positioned underneath the standard blue LED 30 encased within the dome lens 62. Of course, the filter substrate 38 may be positioned relative to the standard blue LED 30 in accordance with the other embodiments as disclosed herein, including those shown with respect to FIGS. 8 and 9.

In each of the embodiments disclosed herein, the size and/or shape of the filter substrate 38, the filter coating 40, the adhesive 42, and/or the filter cup 52 may be sized so that the LED grow light system 26 emits white light. Moreover, the reflectivity of the filter substrate 38, the filter coating 40, the adhesive 42, and/or the filter cup 52 can be adjusted based on the area of coverage. For example, if 50% of blue light needs to be reflected, this can be achieved by using the filter substrate 38, the filter coating 40, the adhesive 42, and/or the filter cup 52 being 50% blue reflective; or the filter substrate 38, the filter coating 40, the adhesive 42, and/or the filter cup 52 may be 100% blue reflective but disposed only over about 50% of the light emission area. Of course, persons of ordinary skill in the art will readily recognize that many combinations of the reflective properties and sizing of the filter substrate 38, the filter coating 40, the adhesive 42, and/or the filter cup 52 may regulate the amount of blue light (or other aspects of the light spectrum) reflected and/or absorbed to attain the desire output light.

FIG. 11 illustrates an embodiment wherein the LED grow light system 26 is integrated within the circuit board 32 having a plurality of discrete lighting systems, including the LED grow light system 26 and a set of alternative LED grow light systems 64-64". Here, the LED grow light system 26 may be any of the aforementioned LED grow light systems 26 as discussed above with respect to FIGS. 6-10. In FIG. 11, the LED grow light system 26 is a composite system integrated into the circuit board 32 along with other alternative LED grow light systems 64-64" to better optimize the emitted spectra designed to more efficiently develop plant growth over time. More specifically, the LED grow light system 26 may be designed as disclosed above to mimic an HPS lamp. Here, the discrete section of the circuit board 32 in FIG. 11 designated by the LED grow light system 26 may be populated with filtered LEDs designed as a direct replacement of the HPS lamp. If other features, such as additional wavelengths at alternative intensities are needed for specific plant growth advantages, which may vary during the growth cycle, other composite LED-based lighting systems can be added to the circuit board 32 (e.g., the alternative LED grow light systems 64-64"). The LED grow light system 26 and/or the alternative LED grow light systems 64-64" may be separately controlled such that a controller may turn each one "ON" and/or "OFF" as needed or desired in real-time during the growth cycle. This feature may allow for use of the alternative LED grow light systems 64-64" in instances where the wavelength and/or intensity specific features of each of the alternative LED grow light systems 64-64" may be used or conserved at certain stages of the growth cycle. For example, special LEDs with spectra in the deep blue, hyper red and far red can be added to the circuit board 32 without an overall change in the design of the circuit board 32 or the grow light. These additional alternative LED grow light systems 64-64" may be used in experimental settings initially with sufficient data collected before they become recipes for large-scale production.

While the LED grow light system 26 and the alternative LED grow light systems 64-64" illustrated in FIG. 11 are discrete regions on the circuit board 32, in actual implementation, the LEDs in each of the LED grow light system 26 and/or the alternative LED grow light systems 64-64" may be spread out and mixed with each other on the circuit board 32, to form a more uniform illumination. The circuit board 32 may be designed such that the LEDs that belong to each of the LED grow light system 26 and the alternative LED grow light systems 64-64" are connected and otherwise controlled collectively and independent of one another.

In other alternative embodiments, the LED grow light systems 26-26''' may also include supplementary light output, e.g., wavelengths that vary in the growth cycle. This may allow growers to develop new light "recipes" that optimize wavelength generation and intensity throughout plant growth to attain higher yielding harvests. This may allow growers to provide adjustments to the LED grow light systems such that growers may switch in and among different modes in real-time. Of course, the aforementioned LED grow light systems 26 could be integrated into existing HPS lamp construction for mass production without investing into new replacement lamps, thus providing for a smoother transition from traditional HPS lamp-based systems to LED-based systems.

Although several embodiments have been described in detail for purposes of illustration, various modifications may be made without departing from the scope and spirit of the invention. Accordingly, the invention is not to be limited, except as by the appended claims.

What is claimed is:
1. An LED grow light system, comprising:
   an LED coupled to a circuit board;
   a phosphor layer generally positioned at least partially over the LED coupled to the circuit board;
   a filter positioned in light receiving relation relative to the LED coupled to the circuit board and in light reflective relation relative to the phosphor layer, the filter comprising a material at least partially reflective of at least a first light output wavelength emitted from the LED for redirection back into the phosphor layer where the reflected first light output wavelength converts to a second light output wavelength for recycled emission out from the LED grow light system as a composite light output component comprising a mixture of the first light output wavelength and the second light output wavelength; and
   an adhesive selectively securing the filter to the phosphor layer, wherein the filter comprises a filter substrate having a filter coating on an external surface area of the LED grow light system.

2. The LED grow light system of claim 1, wherein the second light output wavelength comprises a different wavelength than the first light output wavelength.

3. The LED grow light system of claim 1, wherein the first light output wavelength emitted from the LED grow light system as part of the composite light output component comprises an intensity relatively lower than the first light output wavelength emitted from the LED.

4. The LED grow light system of claim 1, wherein the second light output wavelength emitted from the LED grow light system as part of the composite light output component comprises an intensity relatively higher than the second light output wavelength emitted from the LED.

5. The LED grow light system of claim 1, wherein the LED comprises a blue LED and the first light output wavelength comprises a plurality of wavelengths within a blue spectra and the phosphor layer comprises a yellow phosphor and the second light output wavelength comprises a plurality of wavelengths in a yellow spectra.

6. The LED grow light system of claim 5, wherein the blue spectra comprise wavelengths between about 420-480 nm and the yellow spectra comprise wavelengths between about 560-600 nm.

7. The LED grow light system of claim 1, wherein the filter substrate comprises a generally transparent material and the filter coating comprises the reflective material.

8. The LED grow light system of claim 1, wherein the filter coating comprises a surface area less than coextensive with the filter substrate.

9. The LED grow light system of claim 1, wherein the adhesive comprises a reflective transparent glue, the filter substrate reflects a different wavelength than the filter coating, and the filter substrate permits pass-through of a different wavelength than the filter coating.

10. The LED grow light system of claim 1, wherein the filter includes a surface area coextensive with the phosphor layer.

11. The LED grow light system of claim 1, wherein the filter is at least partially opaque and comprises a 90%-99% reflective rate.

12. The LED grow light system of claim 1, wherein the filter comprises a filter cup coupled to a vertical support and generally positioned above the LED in non-contact relation relative thereto and cooperates with the circuit board to encapsulate the LED therein.

13. The LED grow light system of claim 12, wherein the filter cup adhesively couples to the vertical support, and the vertical support adhesively couples to the circuit board.

14. The LED grow light system of claim 12, including a filter coating coupled to an interior surface of the filter cup.

15. The LED grow light system of claim 1, wherein the circuit board includes multiple of the LEDs coupled thereto and the filter comprises a filter substrate having a plurality of filter coatings thereon and generally discretely aligned with each of the multiple LEDs coupled with the circuit board.

16. The LED grow light system of claim 15, wherein at least two of the plurality of filter coatings comprise a different material composition.

17. The LED grow light system of claim 1, wherein the LED grow light system comprises a flat grow light or a domed grow light.

18. The LED grow light system of claim 17, including an adhesive disposed along an exterior arcuate curvature of the domed grow light and generally forming a horizontal platform for select adhesive coupling with the filter.

19. The LED grow light system of claim 1, including a plurality of discrete LED grow light systems coupled to the circuit board, each including LEDs that vary in color.

20. The LED grow light system of claim 19, including a controller regulating operation of each of the plurality of discrete LED grow light systems in real-time.

21. The LED grow light system of claim 1, wherein the LED comprises multiple LEDs comprising a yellow LED, a green LED, an orange LED, and/or a red LED.

22. The LED grow light system of claim 1, wherein the composite light output component includes a green spectrum intensity of 10%-40% at wavelengths of about 500-570 nm.

23. The LED grow light system of claim 1, wherein the composite light output component includes a yellow spectrum intensity of 60%-90% at wavelengths of about 570-600 nm.

24. The LED grow light system of claim 1, wherein the composite light output component includes a blue spectrum intensity of 0%-20% at wavelengths of about 420-480 nm.

25. The LED grow light system of claim 1, wherein the composite light output component includes an orange spectrum intensity of 55%-100% at wavelengths of about 600-620 nm.

26. The LED grow light system of claim 1, wherein the composite light output component includes a red spectrum intensity of 10%-50% at wavelengths of about 620-700 nm.

27. The LED grow light system of claim 1, wherein the composite light output component includes a deep red spectrum of 5%-20% intensity at wavelengths of about 700-780 nm.

28. An LED grow light system, comprising:
an LED coupled to a circuit board;
a phosphor layer generally positioned at least partially over the LED coupled to the circuit board; and
a filter positioned in light receiving relation relative to the LED coupled to the circuit board and in light reflective relation relative to the phosphor layer, the filter comprising a material at least partially reflective of at least a first light output wavelength emitted from the LED for redirection back into the phosphor layer where the reflected first light output wavelength converts to a second light output wavelength for recycled emission out from the LED grow light system as a composite light output component comprising a mixture of the first light output wavelength and the second light output wavelength, wherein the filter comprises a filter cup coupled to a vertical support, and coupled to the circuit board, and generally positioned above the LED in non-contact relation relative thereto and cooperates with the circuit board to encapsulate the LED therein.

29. The LED grow light system of claim 28, wherein the second light output wavelength comprises a different wavelength than the first light output wavelength.

30. The LED grow light system of claim 28, wherein the first light output wavelength emitted from the LED grow light system as part of the composite light output component comprises an intensity relatively lower than the first light output wavelength emitted from the LED.

31. The LED grow light system of claim 28, wherein the second light output wavelength emitted from the LED grow light system as part of the composite light output component comprises an intensity relatively higher than the second light output wavelength emitted from the LED.

32. The LED grow light system of claim 28, wherein the LED comprises a blue LED and the first light output wavelength comprises a plurality of wavelengths within a blue spectra and the phosphor layer comprises a yellow phosphor and the second light output wavelength comprises a plurality of wavelengths in a yellow spectra.

33. The LED grow light system of claim 32, wherein the blue spectra comprise wavelengths between about 420-480 nm and the yellow spectra comprise wavelengths between about 560-600 nm.

34. The LED grow light system of claim 28, including an adhesive selectively securing the filter to the phosphor layer, wherein the filter comprises a filter substrate having a filter coating on an external surface area opposite the adhesive, the filter substrate comprises a generally transparent material, and the filter coating comprises the reflective material.

35. The LED grow light system of claim 34, wherein the filter coating comprises a surface area less than coextensive with the filter substrate.

36. The LED grow light system of claim 34, wherein the adhesive comprises a reflective transparent glue, the filter substrate reflects a different wavelength than the filter coating, and the filter substrate permits pass-through of a different wavelength than the filter coating.

37. The LED grow light system of claim 28, wherein the filter includes a surface area coextensive with the phosphor layer.

38. The LED grow light system of claim 28, wherein the filter is at least partially opaque and comprises a 90%-99% reflective rate.

39. The LED grow light system of claim 28, wherein the filter cup adhesively couples to the vertical support, and the vertical support adhesively couples to the circuit board.

40. The LED grow light system of claim 28, including a filter coating coupled to an interior surface of the filter cup.

41. The LED grow light system of claim 28, wherein the circuit board includes multiple of the LEDs coupled thereto and the filter comprises a filter substrate having a plurality of filter coatings thereon and generally discretely aligned with each of the multiple LEDs coupled with the circuit board.

42. The LED grow light system of claim 41, wherein at least two of the plurality of filter coatings comprise a different material composition.

43. The LED grow light system of claim 28, wherein the LED grow light system comprises a flat grow light or a domed grow light.

44. The LED grow light system of claim 43, including an adhesive disposed along an exterior arcuate curvature of the domed grow light and generally forming a horizontal platform for select adhesive coupling with the filter.

45. The LED grow light system of claim 28, including a plurality of discrete LED grow light systems coupled to the circuit board, each including LEDs that vary in color.

46. The LED grow light system of claim 45, including a controller regulating operation of each of the plurality of discrete LED grow light systems in real-time.

47. The LED grow light system of claim 28, wherein the LED comprises multiple LEDs comprising a yellow LED, a green LED, an orange LED, and/or a red LED.

48. The LED grow light system of claim 28, wherein the composite light output component includes a green spectrum intensity of 10%-40% at wavelengths of about 500-570 nm.

49. The LED grow light system of claim 28, wherein the composite light output component includes a yellow spectrum intensity of 60%-90% at wavelengths of about 570-600 nm.

50. The LED grow light system of claim 28, wherein the composite light output component includes a blue spectrum intensity of 0%-20% at wavelengths of about 420-480 nm.

51. The LED grow light system of claim 28, wherein the composite light output component includes an orange spectrum intensity of 55%-100% at wavelengths of about 600-620 nm.

52. The LED grow light system of claim 28, wherein the composite light output component includes a red spectrum intensity of 10%-50% at wavelengths of about 620-700 nm.

53. The LED grow light system of claim 28, wherein the composite light output component includes a deep red spectrum of 5%-20% intensity at wavelengths of about 700-780 nm.

54. An LED grow light system, comprising:
multiple LEDs coupled to a circuit board;
a phosphor layer generally positioned at least partially over the multiple LEDs coupled to the circuit board; and
a filter comprising a filter substrate having a plurality of filter coatings thereon and generally discretely aligned with each of the multiple LEDs coupled with the circuit board, the filter positioned in light receiving relation relative to the multiple LEDs coupled to the circuit board and in light reflective relation relative to the phosphor layer, the filter comprising a material at least partially reflective of at least a first light output wavelength emitted from the multiple LEDs for redirection back into the phosphor layer where the reflected first light output wavelength converts to a second light output wavelength for recycled emission out from the LED grow light system as a composite light output component comprising a mixture of the first light output wavelength and the second light output wavelength.

55. The LED grow light system of claim 54, wherein the second light output wavelength comprises a different wavelength than the first light output wavelength.

56. The LED grow light system of claim 54, wherein the first light output wavelength emitted from the LED grow light system as part of the composite light output component comprises an intensity relatively lower than the first light output wavelength emitted from the LED.

57. The LED grow light system of claim 54, wherein the second light output wavelength emitted from the LED grow light system as part of the composite light output component comprises an intensity relatively higher than the second light output wavelength emitted from the LED.

58. The LED grow light system of claim 54, wherein the LED comprises a blue LED and the first light output wavelength comprises a plurality of wavelengths within a blue spectra and the phosphor layer comprises a yellow phosphor and the second light output wavelength comprises a plurality of wavelengths in a yellow spectra.

59. The LED grow light system of claim 58, wherein the blue spectra comprise wavelengths between about 420-480 nm and the yellow spectra comprise wavelengths between about 560-600 nm.

60. The LED grow light system of claim 54, including an adhesive selectively securing the filter to the phosphor layer, wherein the filter comprises a filter substrate having a filter coating on an external surface area opposite the adhesive, the filter substrate comprises a generally transparent material, and the filter coating comprises the reflective material.

61. The LED grow light system of claim 60, wherein the filter coating comprises a surface area less than coextensive with the filter substrate.

62. The LED grow light system of claim 60, wherein the adhesive comprises a reflective transparent glue, the filter substrate reflects a different wavelength than the filter coating, and the filter substrate permits pass-through of a different wavelength than the filter coating.

63. The LED grow light system of claim 54, wherein the filter includes a surface area coextensive with the phosphor layer.

64. The LED grow light system of claim 54, wherein the filter is at least partially opaque and comprises a 90%-99% reflective rate.

65. The LED grow light system of claim 54, wherein the filter comprises a filter cup coupled to a vertical support and generally positioned above the LED in non-contact relation relative thereto and cooperates with the circuit board to encapsulate the LED therein, the filter cup being adhesively coupled to the vertical support and the vertical support being adhesively coupled to the circuit board.

66. The LED grow light system of claim 65, including a filter coating coupled to an interior surface of the filter cup.

67. The LED grow light system of claim 54, wherein at least two of the plurality of filter coatings comprise a different material composition.

68. The LED grow light system of claim 54, wherein the LED grow light system comprises a flat grow light or a domed grow light.

69. The LED grow light system of claim 68, including an adhesive disposed along an exterior arcuate curvature of the domed grow light and generally forming a horizontal platform for select adhesive coupling with the filter.

70. The LED grow light system of claim 54, including a plurality of discrete LED grow light systems coupled to the circuit board, each including LEDs that vary in color.

71. The LED grow light system of claim 70, including a controller regulating operation of each of the plurality of discrete LED grow light systems in real-time.

72. The LED grow light system of claim 54, wherein the LED comprises multiple LEDs comprising a yellow LED, a green LED, an orange LED, and/or a red LED.

73. The LED grow light system of claim 54, wherein the composite light output component includes a green spectrum intensity of 10%-40% at wavelengths of about 500-570 nm.

74. The LED grow light system of claim 54, wherein the composite light output component includes a yellow spectrum intensity of 60%-90% at wavelengths of about 570-600 nm.

75. The LED grow light system of claim 54, wherein the composite light output component includes a blue spectrum intensity of 0%-20% at wavelengths of about 420-480 nm.

76. The LED grow light system of claim 54, wherein the composite light output component includes an orange spectrum intensity of 55%-100% at wavelengths of about 600-620 nm.

77. The LED grow light system of claim 54, wherein the composite light output component includes a red spectrum intensity of 10%-50% at wavelengths of about 620-700 nm.

78. The LED grow light system of claim 54, wherein the composite light output component includes a deep red spectrum of 5%-20% intensity at wavelengths of about 700-780 nm.

79. An LED grow light system having a domed grow light, comprising:
  an LED coupled to a circuit board;
  a phosphor layer generally positioned at least partially over the LED coupled to the circuit board;
  a filter positioned in light receiving relation relative to the LED coupled to the circuit board and in light reflective relation relative to the phosphor layer, the filter comprising a material at least partially reflective of at least a first light output wavelength emitted from the LED for redirection back into the phosphor layer where the reflected first light output wavelength converts to a second light output wavelength for recycled emission out from the LED grow light system as a composite light output component comprising a mixture of the first light output wavelength and the second light output wavelength; and
  an adhesive disposed along an exterior arcuate curvature of the domed grow light and generally forming a horizontal platform for select adhesive coupling with the filter.

80. The LED grow light system of claim 79, wherein the second light output wavelength comprises a different wavelength than the first light output wavelength.

81. The LED grow light system of claim 79, wherein the first light output wavelength emitted from the LED grow light system as part of the composite light output component comprises an intensity relatively lower than the first light output wavelength emitted from the LED.

82. The LED grow light system of claim 79, wherein the second light output wavelength emitted from the LED grow light system as part of the composite light output component comprises an intensity relatively higher than the second light output wavelength emitted from the LED.

83. The LED grow light system of claim 79, wherein the LED comprises a blue LED and the first light output wavelength comprises a plurality of wavelengths within a blue spectra and the phosphor layer comprises a yellow phosphor and the second light output wavelength comprises a plurality of wavelengths in a yellow spectra.

84. The LED grow light system of claim 83, wherein the blue spectra comprise wavelengths between about 420-480 nm and the yellow spectra comprise wavelengths between about 560-600 nm.

85. The LED grow light system of claim 79, including an adhesive selectively securing the filter to the phosphor layer, wherein the filter comprises a filter substrate having a filter coating on an external surface area opposite the adhesive, the filter substrate comprises a generally transparent material, and the filter coating comprises the reflective material.

86. The LED grow light system of claim 85, wherein the filter coating comprises a surface area less than coextensive with the filter substrate.

87. The LED grow light system of claim 85, wherein the adhesive comprises a reflective transparent glue, the filter substrate reflects a different wavelength than the filter coating, and the filter substrate permits pass-through of a different wavelength than the filter coating.

88. The LED grow light system of claim 79, wherein the filter includes a surface area coextensive with the phosphor layer.

89. The LED grow light system of claim 79, wherein the filter is at least partially opaque and comprises a 90%-99% reflective rate.

90. The LED grow light system of claim 79, wherein the filter comprises a filter cup coupled to a vertical support and generally positioned above the LED in non-contact relation relative thereto and cooperates with the circuit board to encapsulate the LED therein, the filter cup being adhesively coupled to the vertical support and the vertical support being adhesively coupled to the circuit board.

91. The LED grow light system of claim 90, including a filter coating coupled to an interior surface of the filter cup.

92. The LED grow light system of claim 79, wherein the circuit board includes multiple of the LEDs coupled thereto and the filter comprises a filter substrate having a plurality of filter coatings thereon, at least two of which comprise a different material composition, and generally discretely aligned with each of the multiple LEDs coupled with the circuit board.

93. The LED grow light system of claim 79, including a plurality of discrete LED grow light systems coupled to the circuit board, each including LEDs that vary in color.

94. The LED grow light system of claim 93, including a controller regulating operation of each of the plurality of discrete LED grow light systems in real-time.

95. The LED grow light system of claim 79, wherein the LED comprises multiple LEDs comprising a yellow LED, a green LED, an orange LED, and/or a red LED.

96. The LED grow light system of claim 79, wherein the composite light output component includes a green spectrum intensity of 10%-40% at wavelengths of about 500-570 nm.

97. The LED grow light system of claim 79, wherein the composite light output component includes a yellow spectrum intensity of 60%-90% at wavelengths of about 570-600 nm.

98. The LED grow light system of claim 79, wherein the composite light output component includes a blue spectrum intensity of 0%-20% at wavelengths of about 420-480 nm.

99. The LED grow light system of claim 79, wherein the composite light output component includes an orange spectrum intensity of 55%-100% at wavelengths of about 600-620 nm.

100. The LED grow light system of claim 79, wherein the composite light output component includes a red spectrum intensity of 10%-50% at wavelengths of about 620-700 nm.

101. The LED grow light system of claim 79, wherein the composite light output component includes a deep red spectrum of 5%-20% intensity at wavelengths of about 700-780 nm.

* * * * *